United States Patent [19]

Kao

[11] Patent Number: 5,802,108
[45] Date of Patent: Sep. 1, 1998

[54] WAVEFORM CORRECTION APPARATUS

[75] Inventor: Chih-Kuang Kao, Hsinchu, Taiwan

[73] Assignee: United Microelectronics Corporation, Hsinchu, Taiwan

[21] Appl. No.: 592,534

[22] Filed: Jan. 26, 1996

[51] Int. Cl.$^6$ .......................... H04B 14/06; H04B 14/04; H04L 25/06
[52] U.S. Cl. ........................ 375/245; 375/317; 375/243
[58] Field of Search ................................. 375/245, 243, 375/244, 254, 247, 241, 242, 316, 340, 317; 341/143, 200; 327/100, 307

[56] References Cited

U.S. PATENT DOCUMENTS

| | | | |
|---|---|---|---|
| 4,540,897 | 9/1985 | Takaoka et al. | 375/317 |
| 4,575,683 | 3/1986 | Roberts et al. | 375/317 |
| 4,926,442 | 5/1990 | Bukowski et al. | 375/317 |
| 5,210,712 | 5/1993 | Saito | 364/825 |
| 5,230,060 | 7/1993 | Naitoh | 375/245 |

FOREIGN PATENT DOCUMENTS 281757  7/1996  Taiwan .

*Primary Examiner*—Stephen Chin
*Assistant Examiner*—Betsy L. Deppe
*Attorney, Agent, or Firm*—Cushman Darby & Cushman IP Group of Pillsbury Madison & Sutro LLP

[57] ABSTRACT

A waveform correction apparatus is disclosed. The waveform correction apparatus includes a signal generator for generating a signal; a maximal value recorder for recording a maximal value of the signal waveform; a minimal value recorder for recording a minimal value of the signal waveform; a difference value generator for generating a difference value of the maximal value and the minimal value; and a comparative controller for comparing the difference value with a reference value. The comparative controller outputs a corrected waveform when the difference value is larger than the reference value, otherwise it outputs the original waveform generated by the waveform generator. The corrected waveform is formed by shifting up or down the original waveform by a constant value.

11 Claims, 5 Drawing Sheets

WAVEFORM CORRECTION APPARATUS

BACKGROUND OF THE INVENTION

1. Field of the Invention

The present invention relates in general to signal processing. More specifically, the invention is directed to an arrangement (apparatus and method) for correcting a waveform that would otherwise be distorted by a process of analog to digital conversion, digital signal processing, and recovery of a digital signal.

2. Description of Related Art

Recent progress in semiconductor and digital technology has spawned a myriad of electronic products. Electronic products that transmit, store or process digital signals have become especially popular. One reason for is this popularity is that the digital signals can generally be stored and transmitted more easily than analog signals. Moreover, digital signals can be processed as desired to achieve specific effects, such as encoding, decoding, mixing etc. Therefore, most new audio systems now utilize digital signal processing.

Among the various signal processing schemes for digitized audio signals, the Adaptive Delta Modulation (ADM) method is known to be one of the most economical methods and one that produces high quality. ADM transforms an analog signal, such as an analog audio signal, into a digital signal (stream of bits) that can be signal processed using digital techniques. The digital signal that results from signal processing can then be converted into an analog audio signal, as needed, to drive speakers or analog input devices. The digital signal is a sequence of digital data bits which represent the values of an audio signal waveform that has been sampled, usually at a rate of 16 kHz to 22 kHz. The sampling rate is sleeted to be sufficiently high to capture the highest frequency components of the audio signal needed to maintain good fidelity. Typically a one-second duration audio signal waveform can be sampled into a 16–22 kbit sequence of data bits. Despite various advantages of using digital signal processing, a problem can occur. In transforming analog audio data into digital form, digitally processing it, and then converting processed digital data into analog form distortion may occur in the recovered audio signal if an error bit occurs during digital processing.

Two different conventional ADM circuits are depicted in FIGS. 1 and 2 (both Prior Art), respectively. The circuit depicted in FIG. 1 (Prior Art) receives an audio signal S(n), digitizes it into a digital signal (sequence of bits) B(n), transmits the digital signal B(n), and then converts digital signal B(n) into a signal A'(n) which can be processed into an audio signal. The functions of the circuit of FIG. 2 (Prior Art) are similar to those of the circuit of FIG. 1 (Prior Art), except that the input signal in FIG. 2 (Prior Art) is an analog audio signal, and a digital-to-analog converter (DAC) is provided to transform digital processed signals into an analog signal. Since the circuit functions in FIG. 1 (Prior Art) and FIG. 2 (Prior Art) are similar, only FIG. 1 (Prior Art) will be described in the following paragraphs.

In the circuit shown in FIG. 1 (Prior Art), the encoding end, i.e., (left portion of the figure), of the ADM circuit includes a subtractor 11, a quantizer 12, an encoder 13, a step controller 14, an adder 15 and a delay 16. Subtractor 11 is provided with an input to receive audio signal S(n). It generates a sign signal T(n) which indicates either a positive or a negative value. Quantizer 12 is controlled by sign signal T(n) to send a quantified value Q(n) to encoder 13. The amplitude of quantified value Q(n) can be more flexible if quantizer 12 is further controlled by a step controller 14 which provides feedback from the output end of encoder 13. Quantified value Q(n) is accumulated by adder 15 and delay 16 to generate accumulated signal A(n). The aforementioned relationships of the signals can be expressed by the following equations.

$$T(n) = S(n) - A(n-1)$$
$$Q(n) = +\Delta(n) \text{ and } B(n) = 1, \text{ for } T(n) \geq 0$$
$$= -\Delta(n) \text{ and } B(n) = 0, \text{ for } T(n) < 0$$
$$A(n) = A(n-1) + Q(n)$$

wherein $\Delta(n)$ is a positive value which can be modified by step controller 14.

The waveforms of input signal S(n) and the accumulated signal A(n) are both depicted in FIG. 3. The waveform of signal A(n) is approximated to that of signal S(n). The former can be more approximated to the latter if step controller 14 modifies properly quantified value Q(n) according to the waveform of signal S(n). For example, when signal S(n) increases abruptly, signal B(n) will consist of a number of successive bits of value 1. If the waveform of signal A(n) is still lower than that of signal S(n), step controller 14 has to increase the amplitude of $\Delta(n)$ to make A(n) closer to S(n). Similarly, if signal S(n) falls abruptly and the waveform of A(n) is always higher than that of S(n), the amplitude of $\Delta(n)$ has to be increased to further lower the waveform of A(n). Alternatively, when signal B(n) appears to be a sequence of {101010 . . . }, the waveform of signal A(n) may oscillate up and down the waveform of signal S(n). Then the amplitude of $\Delta(n)$ must be reduced so that signal A(n) can approach to signal S(n).

The right portion of the circuit of FIG. 1 (Prior Art) decodes digital signal B(n) to signal A'(n) which can be converted into an analog signal. Signal A'(n) can be obtained by accumulating $+\Delta(n)$ or $-\Delta(n)$ according to the bit values of signal B(n). That is, when B(n) has a bit of value 1, A'(n) equals $T(n-1)+(+\Delta(n))$. Alternatively, when B(n) has a bit value 0, A'(n) can be obtained from $T(n-1)+(-\Delta(n))$. The amplitude of $\Delta(n)$ is adjustable as stated above.

The circuitry of FIG. 1 (Prior Art) is intentionally made somewhat "generic". It has application to many kinds of devices. For example, the left portion of the circuit could be a digital recorder, and the right portion a player. Therefore, the ATM circuit shown could represent a digital audio system for recording and playing sounds.

However, as mentioned above, if bit errors occur in digital signal B(n), the recovered audio signal may be seriously distorted. For example, a portion of the waveform of signal S(n) shown in FIG. 3 can be decoded to a digital signal sequence of {111101101 . . . } whose accumulated signal A(n) is very close to signal S(n). If the received digital signal has an erroneous bit (e.g., the fifth bit) and becomes {111111101 . . . }, its corresponding accumulated signal A'(n) will go too high to approximate the original audio signal S(n).

Since an audio system has limitations on the amplitudes of audio signals, any signal that exceeds such limitations can not be processed and the sound will be distorted. For example, when an audio signal S1 is encoded as a digital signal and then decoded as another audio signal S2, if an erroneous bit exists in the digital signal, the waveform of signal S2 will be distorted.

FIG. 4 is a schematic diagram illustrating signal distortion due to bit errors of the digital signal in the circuit of FIG. 1 (Prior Art). The waveform of signal S1 has all of its portions within a proper expected range of an analog audio signal from a maximal value Vmax to a minimal value Vmin, of the audio system. If two bit errors occur in the intermediate digital signal of S1 and S2, the waveform of signal S2 goes higher than S1 at point A where a first bit error occurs, and then goes still higher at point B because of another bit error. The difference between signal S1 and S2 after the second error bit can be as large as four times the quantified value Δ(n). Therefore, the waveform of signal S2 may go beyond high value limitation Vmax of the audio system so as to distort between point C and D, as shown.

The ATM circuit, given it many attributes, is still good for audio system digital signal processing. However, the distortion problem caused by occasional bit errors must be overcome, or the performance of the audio system will be adversely affected.

SUMMARY OF THE INVENTION

Accordingly, the present invention provides a waveform correction apparatus for preventing signal distortion of an ADM circuit.

The waveform correction apparatus of the present invention includes a signal generator for generating a signal; a maximal value recorder for recording a maximal value of the signal waveform; a minimal value recorder for recording a minimal value of the signal waveform; a difference value generator for generating a difference value of the maximal value and the minimal value; and a comparative controller for comparing the difference value with a reference value. The waveform generator can be a decoder portion of an ADM circuit. The controller outputs corrected waveforms when the difference value is larger than the reference value. Otherwise, it outputs the original waveform generated by the waveform generator. The corrected waveform is formed by shifting up or down the original waveform by a constant value. By using waveform shifting, signal distortion can be prevented.

BRIEF DESCRIPTION OF THE DRAWINGS

Other objects, features, and advantages of the present invention will become apparent from the following detailed description of the preferred but non-limiting embodiment. The description is made with reference to the accompanying drawings in which.

DETAILED DESCRIPTION OF THE INVENTION

In general, the amplitude of the upper half of an audio signal waveform approximates that of its lower half. The invention described herein takes advantage of this characteristic. In the waveforms shown in FIG. 5, the solid line waveform is an "ideal" audio signal which has balanced shapes above and below a mid-value Vmid. That is, the distance between point A1 and Vmid is substantially the same as that between B1 and Vmid, and the distance between A3 and Vmid is substantially the same as that between B3 and Vmid. Therefore, a distorted signal can be corrected by restoring it to proper symmetry or balance as in the case of an "ideal" audio signal.

In the following discussion we assume the use of an audio system that is a five-bit system. It provides 32 possible sample values from a minimal value of (00000) to a maximal value (11111) for recording waveforms of analog signals. Vmid, the mid-value of the waveform, corresponds to a value of (10000). Therefore, positions of the local maximum of the waveform shown in FIG. 5 can be A1 (10010), A2 (10100), A3 (10110) and A4 (11000), and those of local minimum can be B1 (01110), B2 (01100), B3 (01010) and B4 (01000).

Figure 5:
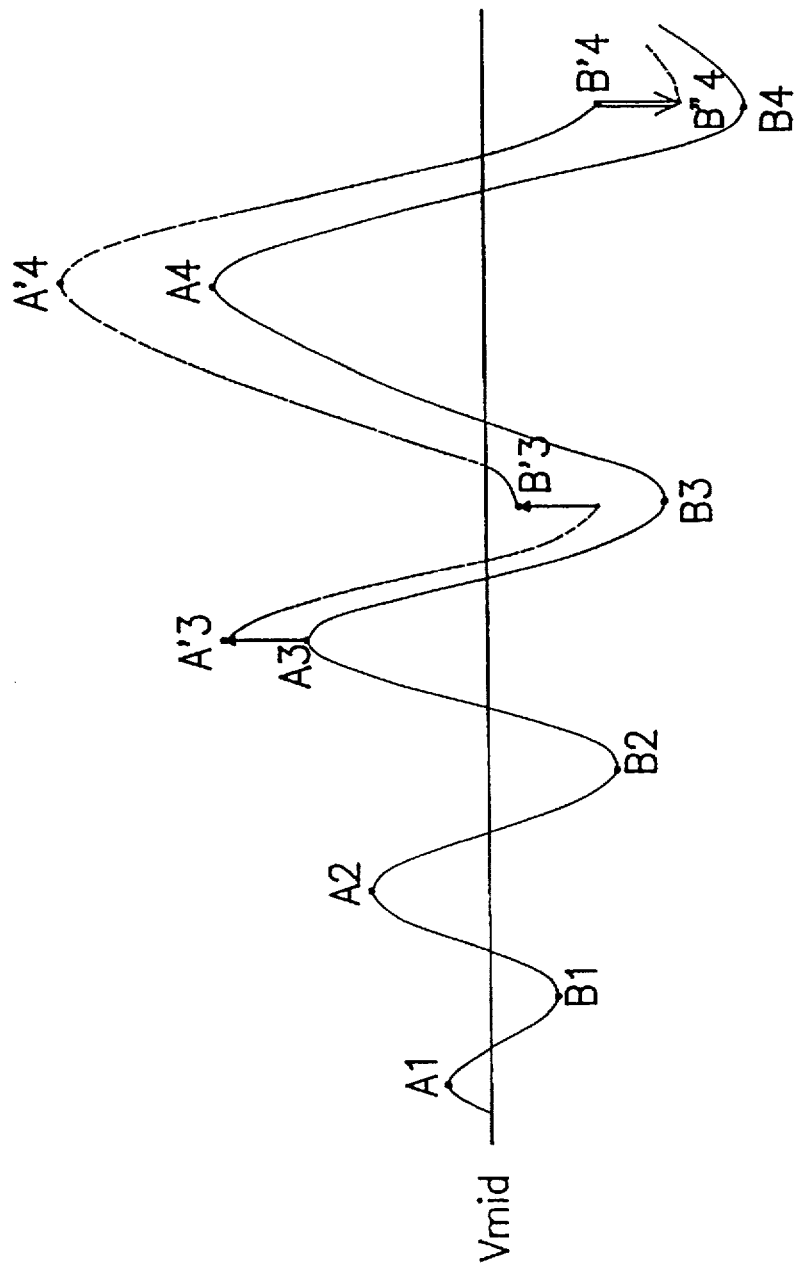
FIG. 5 illustrates the waveform-correcting process of the invention.

As mentioned above, the ADM circuit may produce bit errors in the digital signal processing procedure, causing the recovered analog signal to not be the same as the original signal. An example is shown in FIG. 5. Two bit errors occur, one at point A3 and one at point B3. Therefore, the recovered waveform, which is depicted in dashed line in the figure, will have one new local minimum B'3 (01110) and two new local maximum A'3 (11000) and A'4 (11100). The latter is very close to the upper limit of the audio system, i.e., maximal value (11111). If the recovered waveform is not corrected, the signal distortion will occur. The present invention therefore corrects the waveform immediately at point B'4 by shifting the whole waveform down to a proper position, such as moving B'4 (01100) to the new position of B"4 (01010).

In the present invention, the correction of the recovered waveform is determined by judging the difference of distances to mid-value Vmid from any adjacent local maximum and local minimum. That is, if the distance difference exceeds a reference value, the waveform is considered to be unbalanced, and the waveform correction is required. For example, as shown in FIG. 5, since the distance between point A'4 and Vmid is much greater than that between point B'3 and Vmid, and their difference is greater than a predetermined reference value, the audio system corrects the recovered waveform immediately at point B'4 to prevent the signal distortion.

Figure 6:
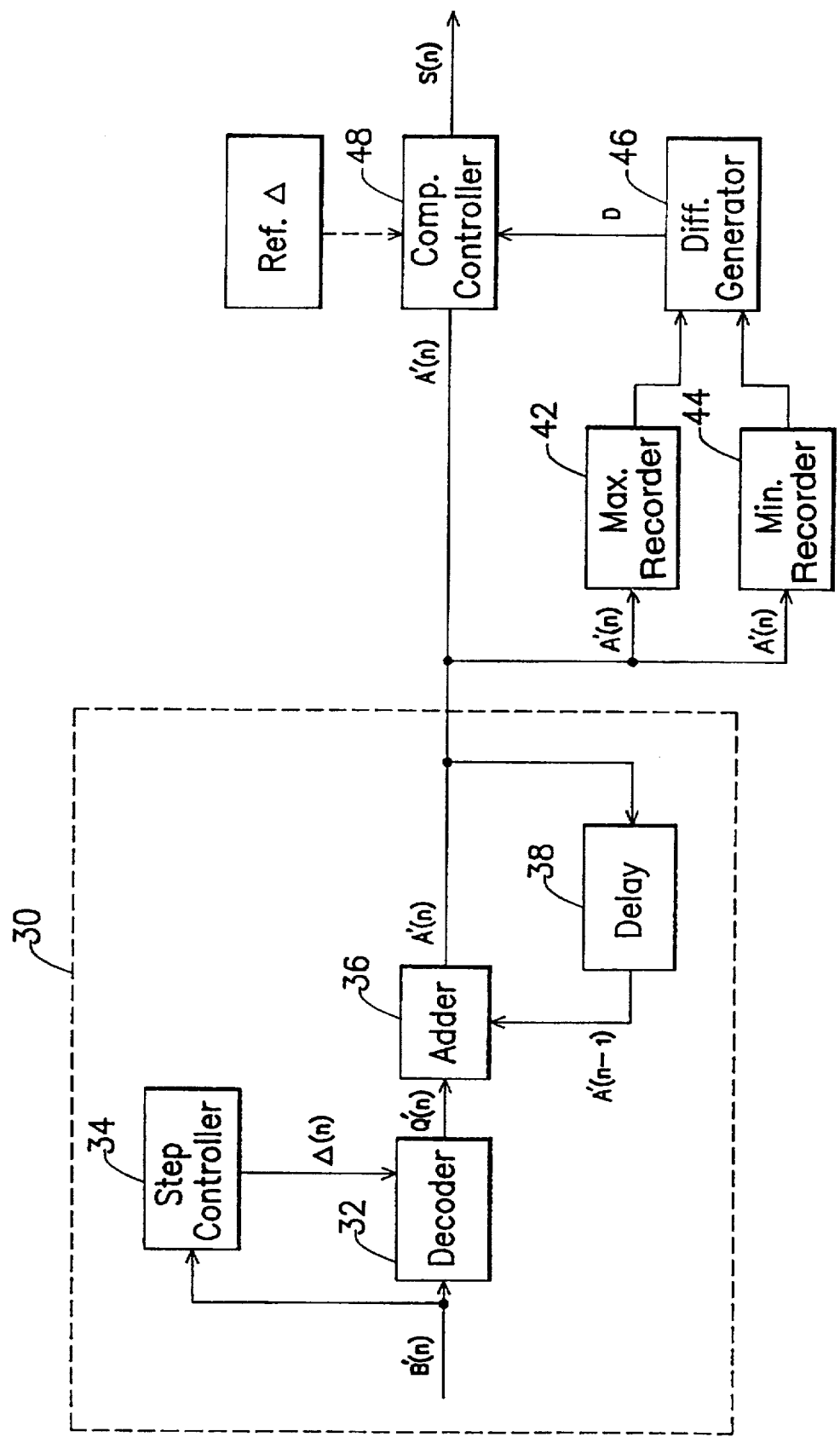
FIG. 6 illustrates a waveform-correction apparatus according to the preferred embodiment of the invention.

Accordingly, the apparatus for correcting the waveform of the present invention can have the circuit structure illustrated in FIG. 6. The circuit includes a waveform generator 30. A signal from waveform generator 30 is coupled to both a maximal value recorder 42 and a minimal value recorder 44. The outputs of maximal value recorder 42 and minimal value recorder 44 are coupled to a difference generator 46 which provides a difference signal to a comparative controller 48.

Figure 1:
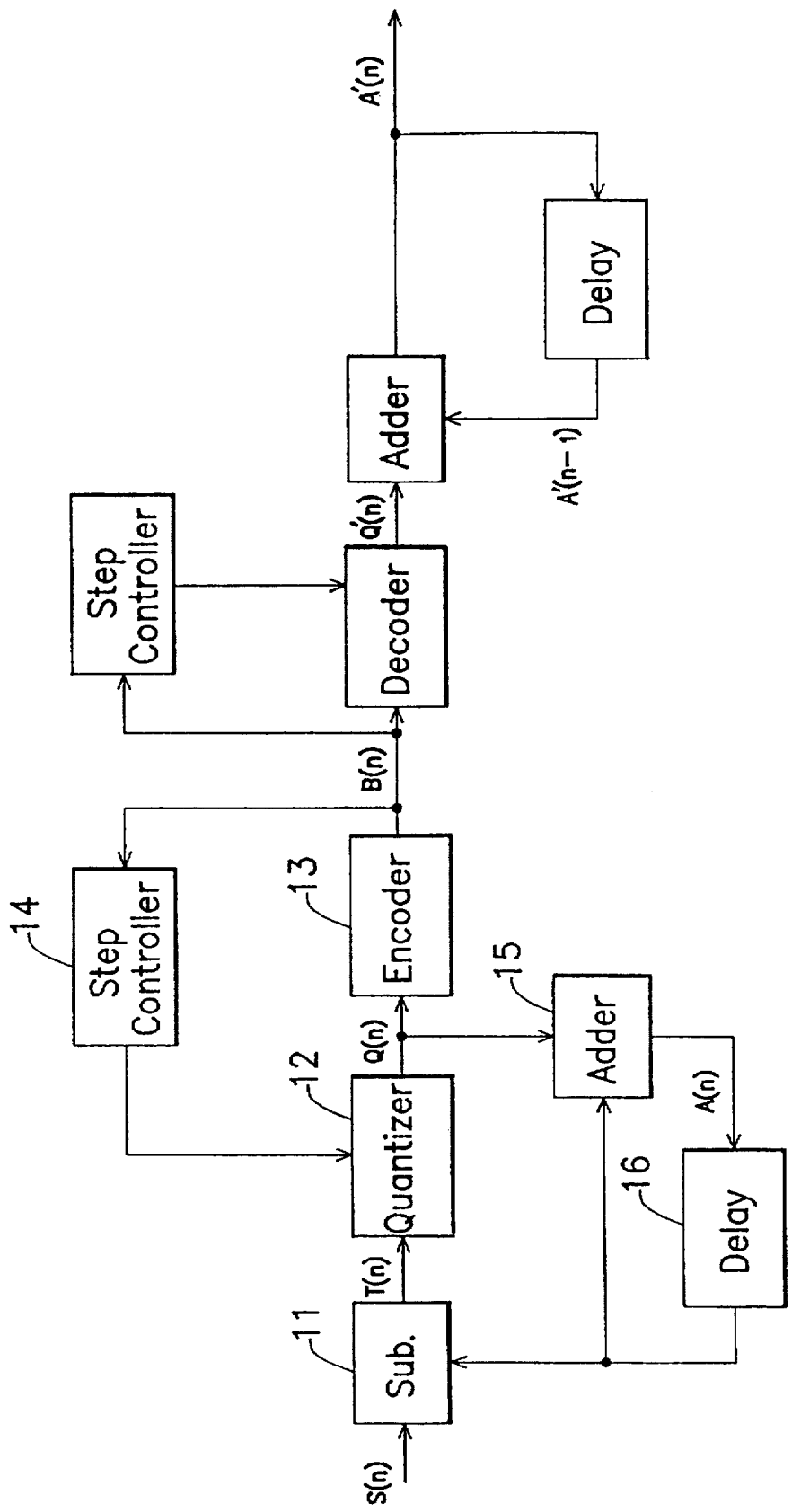
FIG. 1 (Prior Art) is a circuit diagram illustrating a conventional ADM digital signal processing system.
Figure 2:
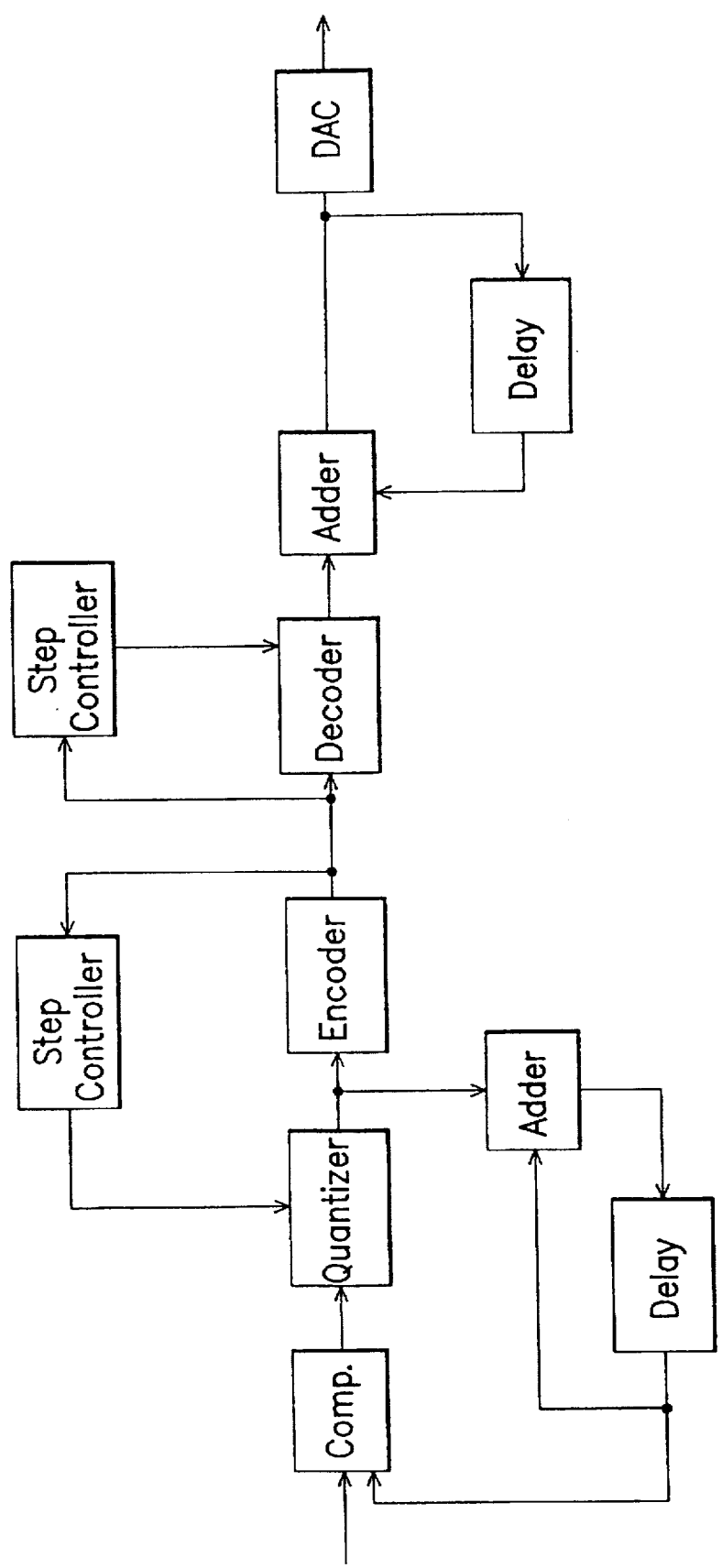
FIG. 2 (Prior Art) is a circuit diagram illustrating another conventional ADM digital signal processing system.
Figure 3:
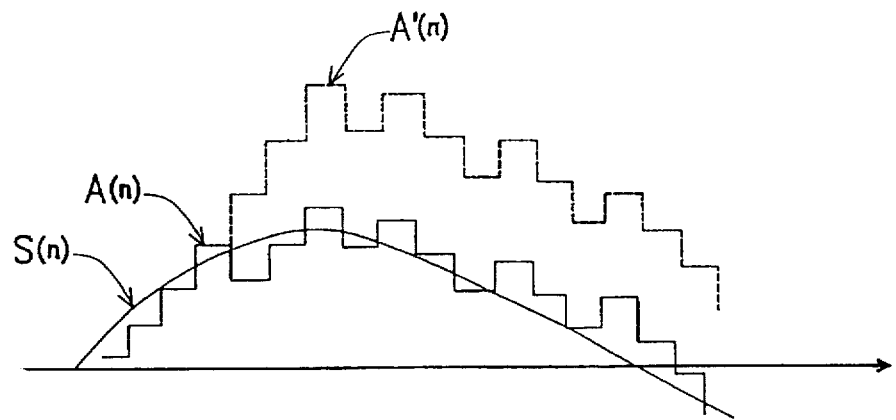
FIG. 3 is a schematic diagram illustrating the relationships between an original input signal and an error signal in the circuit of FIG. 1 (Prior Art)
Figure 4:
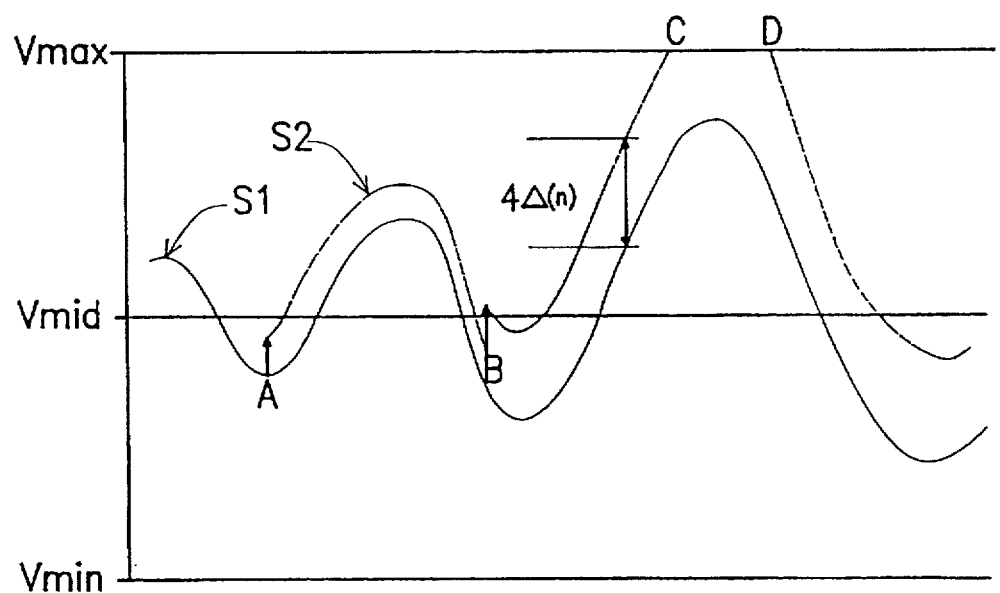
FIG. 4 is a schematic diagram illustrating the signal distortion phenomenon due to bit errors of the digital signal in the circuit of FIG. 1 (Prior Art)

Waveform generator 30 recovers a digital signal as an accumulated signal or an analog signal. The structure of waveform generator can be similar to the right portion of the ADM circuit illustrated in FIG. 1 (Prior Art). In the preferred embodiment of the invention, waveform generator 30 includes a decoder 32 which decodes an input digital signal B'(n) to a quantified signal Q'(n). A step controller 34 adjusts the amplitude of quantified signal Q'(n) by an adjustable quantified value Δ(n). An adder 36 and delay 38 accumulate quantified signal Q'(n) as an accumulated signal A'(n) which is the recovered signal of the ADM circuit.

A real-time local maximal value of recovered signal A'(n) will be recorded in maximal value recorder 42, and a real-time local minimal value is stored in minimal value recorder 44. Difference generator 46 reads the values of both the maximal value recorder 42 and the minimal value recorder 44 and generates a difference value D. Difference generator 46 finds firstly the distance between the maximal value and mid-value Vmid, then the distance between the minimal value and mid-value Vmid, and then subtracts the two distances to generate difference value D. Therefore, if the waveform shifts too high, difference value D will be a large positive value. Alternatively, if the waveform shifts too low, difference value will be a negative value.

Comparative controller 48 compares the absolute value of difference value D with a predetermined reference value $\Delta$ to judge the shifted amount of the waveform. Reference value $\Delta$ can be chosen as desired. In the preferred embodiment of the invention, it can be one half of the difference value between Vmax and Vmid. When difference value D is larger than reference value $\Delta$, and D is a positive value, the waveform has to be shifted down by a constant value to prevent signal distortion. Alternatively, when absolute value of D is larger than reference value $\Delta$, and D is negative, the waveform has to be shifted up. That is, if value |D| is larger than reference value $\Delta$, the waveform is shifted up (down) by adding a positive (negative) constant value in comparative controller 48, thus correcting the waveform to its proper position. In the present invention, the constant value can be one half of difference value D, i.e., ½D. The corrected waveform for |D|>$\Delta$, or the original waveform for |D|<$\Delta$ is then output through comparative controller 48 as signal S(n).

The aforementioned correcting circuit will be explained in accompaniment with the waveform illustrated in FIG. 5. If waveform generator 30 generates a waveform including the portion from point A1 to B1, maximal value recorder 42 records the position of point A1, and minimal value recorder 44 records the position of point B1. Difference generator 46 finds the distance between point A1 and mid-value Vmid, i.e., value $\overline{A1Vmid}$, and the distance between point B1 and Vmid, i.e., value $\overline{B1Vmid}$. Since the difference value of $\overline{A1Vmid}$ and $\overline{B1Vmid}$ is smaller than reference value $\Delta$, that is, |$\overline{A1Vmid}$−$\overline{B1Vmid}$|=|D|<$\Delta$, the waveform can be outputted without correction. Similarly, since the waveform including the portion before point A3 shown in FIG. 5 has balanced shapes, it can be outputted through comparative controller 48 without correction.

However, as there are two bit errors in digital signal B'(n), the waveform after point A3 is shifted up. The two bit errors which occur at point A'3 and B'3 produce a larger real-time local maximal value at point A'4, thus increasing the distance $\overline{A'4Vmid}$. On the contrary, the local minimal value at point B'4 is so high that the distance to mid-value Vmid is reduced, that is, value $\overline{B'4Vmid}$ is quite small. Therefore, the difference between $\overline{A'4Vmid}$ and $\overline{B'4Vmid}$ is larger than reference value $\Delta$, i.e., |$\overline{A'4Vmid}$−$\overline{B'4Vmid}$|=|D|>$\Delta$, and the waveform has to be corrected.

As shown in the FIG. 5, the waveform after point B'4 is corrected by shifting down a constant value. In the present embodiment, the constant value is one half of difference value D, i.e., ½D. Therefore, the comparative controller outputs signal S(n) which equals A'(n) before point B'4 and equals A'(n)+½D after point B"4. That is, the corrected signal S(n) equals A'(n)±½D so that no signal distortion occurs.

What is claimed is:

1. An apparatus for correcting the waveform of a signal, comprising:

a signal generator for generating the signal;

a maximal value recorder for recording a local maximal value of the waveform of the signal;

a minimal value recorder for recording a local minimal value of the waveform of the signal;

a difference value generator for generating a difference value according to the local maximal value and the local minimal value;

a comparative controller for comparing the difference value with a reference value; the comparative controller outputting the signal when the difference value is smaller than the reference value, and when the difference value is larger than the reference value outputting a signal that has been shifted, thereby providing a corrected waveform.

2. The apparatus as claimed in claim 1, wherein the difference value is equal to a difference between the maximal value and the minimal value.

3. The apparatus as claimed in claim 1, wherein the corrected waveform is formed by shifting up or down the waveform.

4. The apparatus as claimed in claim 3, wherein the waveform is shifted up or down by one half of the difference value.

5. The apparatus as claimed in claim 1, wherein the signal generator includes:

a decoder for receiving a digital signal;

a step controller for generating a quantified value to the decoder;

an adder for accumulating a quantified signal to be the signal for correcting; and a delay forming a feedback for the adder.

6. The apparatus as claimed in claim 1, wherein the signal generator is a decoder portion of an Adaptive Delta Modulation (ADM) circuit.

7. A method for correcting waveform of an input signal, comprising the steps of:

recording a local maximal value of the waveform of the input signal;

recording a local minimal value of the waveform of the input signal;

finding a difference value according to the local maximal value and the local minimal value;

comparing the difference value with a reference value; and shifting the waveform when the difference value is larger than the reference value, and retaining the waveform when the difference value is smaller than the reference value.

8. The method as claimed in claim 7, wherein the difference value is equal to a difference between the maximal value and the minimal value.

9. The method as claimed in claim 7, wherein the waveform is corrected by either being shifted up or down a constant distance.

10. The method as claimed in claim 9, wherein the constant is one half of the difference value.

11. The method as claimed in claim 7 wherein the input signal is an analog signal which is decoded from a digital signal.

* * * * *